US006892154B1

(12) United States Patent
Lee

(10) Patent No.: US 6,892,154 B1
(45) Date of Patent: May 10, 2005

(54) METHOD AND APPARATUS FOR DEVELOPING MULTIPLE TEST CASES FROM A BASE TEST CASE

(75) Inventor: Douglas Lee, Cupertino, CA (US)

(73) Assignee: Adaptec, Inc., Milpitas, CA (US)

( * ) Notice: Subject to any disclaimer, the term of this patent is extended or adjusted under 35 U.S.C. 154(b) by 107 days.

(21) Appl. No.: 10/140,236

(22) Filed: May 6, 2002

(51) Int. Cl.[7] .............................................. G01F 19/00
(52) U.S. Cl. ...................... 702/108; 702/81; 702/117; 702/123; 716/4; 716/5; 714/737; 714/738; 714/735; 324/500; 324/763; 324/765
(58) Field of Search ..................... 702/57, 69, 81–82, 702/108–109, 117, 123, 182, 183, 186, 189, 103, FOR 104, 135, 155, 157, 159, 160, 162, 163, 170, 171; 716/4, 5, FOR 489, 490, 491; 714/724–745, FOR 100, 101, 293; 324/763, 765

(56) References Cited

U.S. PATENT DOCUMENTS

| 5,978,940 | A | * | 11/1999 | Newman et al. ............ 714/712 |
| 6,038,378 | A | * | 3/2000 | Kita et al. .................... 714/38 |
| 6,421,822 | B1 | * | 7/2002 | Pavela ......................... 717/125 |
| 6,523,151 | B2 | * | 2/2003 | Hekmatpour ................. 716/4 |
| 2003/0061581 | A1 | * | 3/2003 | Baumgartner et al. ......... 716/4 |

FOREIGN PATENT DOCUMENTS

| JP | A-07-326649 | 12/1995 |
| JP | A-07-335711 | 12/1995 |
| JP | A-09-064142 | 3/1997 |

OTHER PUBLICATIONS

Bose, "Performance Test Case Generation for Microprocessors", Jan. 1999, IBM Watson Research Center, pp. 1–6.*

Brand, Exhaustive Simulation Need Not Require an Exponential Number of Tests, Nov. 1993, IEEE, vol.: 12, No: 11, pp. 1635–1641.*

Sun et al., "An Intelligent Software–Integrated Environment of IC Test", Jan. 1994, IEEE, vol.: 25, No: 3, pp. 594–603.*

* cited by examiner

Primary Examiner—Marc S. Hoff
Assistant Examiner—Elias Desta
(74) Attorney, Agent, or Firm—Martine & Penilla LLP

(57) ABSTRACT

A system and method for generating a test case for testing a device to be connected to a computer is disclosed. A base test object is provided. The base test object defines test properties for a device. The base test object includes a transaction generator that generates transactions. An extending test object is created, the extending test object defines test properties for a distinct configuration of the device. The extending test object also inherits at least one test property of the base test object. The transaction generator is executed to generate several transactions for the test case, each of the transactions defining a stimulus being specifically designed to stimulate at least one test property of the distinct configuration of the device.

36 Claims, 4 Drawing Sheets

METHOD AND APPARATUS FOR DEVELOPING MULTIPLE TEST CASES FROM A BASE TEST CASE

CROSS REFERENCE TO RELATED APPLICATIONS

This application is related to U.S. Patent Application No. 10/090,353 filed on Mar. 1, 2002 by Douglas Lee, and entitled "Apparatuses and Methods for Modeling Shared Bus Systems," which is incorporated herein by reference in its entirety.

BACKGROUND OF THE INVENTION

1. Field of the Invention

The present invention relates generally to device testing processes, and more particularly, to methods and apparatus for developing testing systems for testing electrical devices.

2. Description of the Related Art

Development of a new device such as an integrated circuit, or other electronic device, requires extensive testing to determine if a proposed design meets the design performance requirements. One approach to developing a new device includes simulating the device such as by designing a computer program that simulates the operation of the device. Such a computer program is typically referred to as a device simulation. Device simulations are typically run in a test bench environment. Multiple test procedures or test cases are then applied to a device simulation running on the test bench. A test suite is a collection of test cases that test multiple functions of a simulated device.

Typically each test case is in the form of computer readable code executable by the test bench. A test case causes the test bench to apply stimuli to the device simulation and record the simulated device operation. Various functions of the simulated device can then be tested. Simulated device operations can include input, output, processing, events, signal levels, and any other device function.

Test cases are often written using object oriented programming languages such as C++, Java™ and other languages. Generally speaking, methods of a test object are designed to invoke the methods of a number of objects, thus causing very specific stimuli to be applied the device simulation.

Accordingly, the code programmed for each test case is specifically designed for each device to be tested. In practice, a test case for a device (e.g., a second-generation of the device) is typically developed by first selecting a similar device (e.g., a previous generation of the device) that is most similar to the device. The first test case for the similar device is selected because the first test case presumably, successfully tested the similar device and is therefore believed to be accurate, comprehensive and properly debugged. The first test case is then modified to test the specific function of the device to be tested.

As a result, the test cases often become difficult to determine precisely what functions of the device are being tested. Further, as the test cases become successively modified, the performance data can become more difficult to obtain and less accurate and less comprehensive. Accurate and comprehensive performance data is important so that a first device under test can be directly and accurately compared to another device under test (e.g., a second-generation device).

In addition, developing a new test suite for a second-generation device upon the test suite developed for a first generation device typically requires extensive man-hours to modify and debug. Further, if a fault is found in the new test suite and the fault is corrected during the testing or development of the second-generation device, then the fault may also apply to the first generation device. Therefore the test suite for the first generation device may also require a corresponding correction.

A test suite may include many hundreds of test cases that are similar. When a defect is found in a selected test case, often most or all of the similar test cases must also be corrected. Therefore, even a minor defect discovered in one test case in the new test suite, often results in extensive efforts to update each of the similar test cases in the new test suite and in any similar test suites.

In view of the foregoing, there is a need for a system and method for rapidly generating test cases that produce accurate, comprehensive test results, and have a testing scope that can be easily determined.

SUMMARY OF THE INVENTION

Broadly speaking, the present invention fills these needs by providing a system and method for generating a test case for testing a device to be connected to a computer is disclosed. A base test object is provided. The base test object defines test properties for a device. The base test object includes a transaction generator that generates transactions. An extending test object is created, the extending test object defines test properties for a distinct configuration of the device. The extending test object also inherits at least one test property of the base test object. The transaction generator is executed to generate several transactions for the test case, each of the transactions defining a stimulus being specifically designed to stimulate at least one test property of the distinct configuration of the device.

In another embodiment, the extending test object, includes overriding at least one test property in the base test object. A test property can include a function of the device and/or an operating parameter of the device.

In another embodiment, the stimulus can include multiple transaction objects. The stimulus can include a read, a write, an event and an interrupt.

In one embodiment, the transaction generator controls the transactions. Controlling the transactions can include controlling the type of transaction and/or controlling the rate of the transactions.

In one embodiment, the base test object includes a goal for the base test case. The goal can define an end to the base test case. The goal can include a default goal. A default goal can include a completion of the generation of the transactions.

In one embodiment, the device being tested is a simulated device. Alternatively, the device being tested can be an actual hardware device.

In one embodiment, a modification to the base test object modifies the function of the extending test object.

In an alternative embodiment, a system and method for generating a test case for testing a device to be connected to a computer is disclosed. A base test class is provided. The base test class defines test properties for a device. The base test class includes a transaction generator that generates transactions. An extending test class is created, the extending test class defines test properties for a distinct configuration of the device. The extending test class also inherits at least one test property of the base test class. The transaction generator is executed to generate several transactions for the test case, each of the transactions defining a stimulus being specifically designed to stimulate at least one test property of the distinct configuration of the device.

In still another embodiment, a test bench is disclosed. The test bench includes a processor and a storage facility coupled to the processor. The storage facility includes instructions executable by the processor. The instructions include a base test object. The base test object defines test properties for a device. The base test object includes a transaction generator that generates transactions. An extending test object is created, the extending test object defines test properties for a distinct configuration of the device. The extending test object also inherits at least one test property of the base test object. The transaction generator is executed to generate several transactions for the test case, each of the transactions defining a stimulus being specifically designed to stimulate at least one test property of the distinct configuration of the device.

In another embodiment, a system and method for testing a device is disclosed. The method includes defining a base test object for the device. The base test object being configured to exercise basic operations of the device. An extending test object is defined. The extending test object being configured change an overall operation of the device to be tested. The extending test object identifying transactions to be processed so as to change the overall operation of the device.

In one embodiment, the base test object includes a function generator, which generates the identified transactions and a goal, which determines when the base test is complete.

In one embodiment, several extending tests objects can modify the base test object.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

Figure 1:
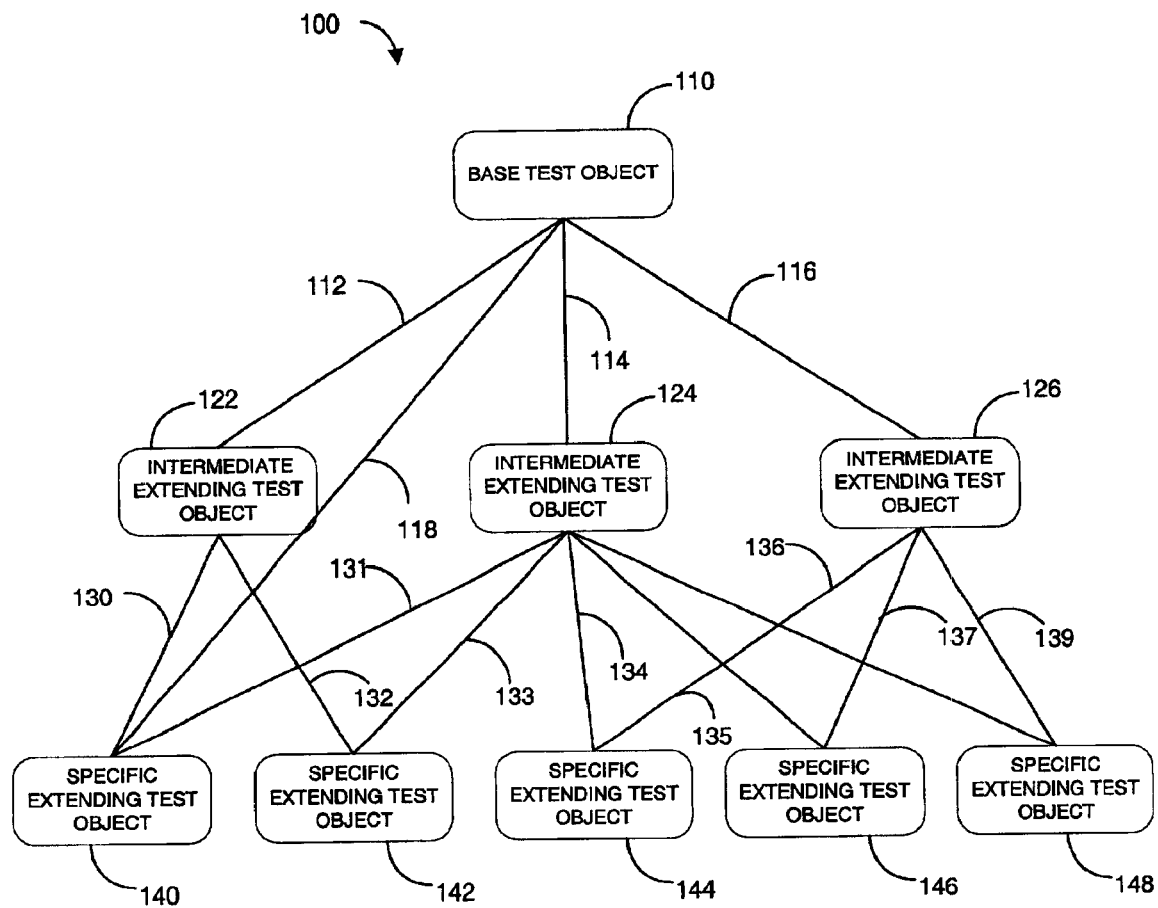
FIG. 1 is a graphical representation of an object-oriented program that implements a test suite in accordance with one embodiment of the present invention.

Several exemplary embodiments for generating a test case for testing a device will now be described. It will be apparent to those skilled in the art that the present invention may be practiced without some or all of the specific details set forth herein.

Device manufacturers are under constant pressure to reduce the development time for new devices. One area of reducing the development time is reducing the time required to test various proposed, and often competing configurations of the device. As discussed above, the prior art approach to testing a new device was to modify an existing test object to generate a modified test case, which can then be applied to the new device. However, the administrative management requirements of the prior art approach cause additional delays in device development time.

In the prior art, each test suite may test a portion of the basic operation of the device, therefore if a change to the basic operation of the device was made, then all test cases that test the basic operation of the device must be updated. One advantage of the present invention is that with all of the basic functions of the device under test included in one test case, then only the one test case need be updated when the basic operations of the device is changed.

As discussed above, test cases are often programmed in an object-oriented language such as C+, C++, Java and other object-oriented languages. Test cases can also be programmed in specialized language applications for test bench operations such as Vera, available from Synopsys, Inc. of Mountain View, Calif., Verilog and other similar programming languages.

Object-oriented programming is a method of creating computer programs by combining certain fundamental building blocks, and creating relationships among and between the building blocks. The building blocks in object-oriented programming systems are called "objects." An object is a programming unit that groups together a data structure (instance variables) and the operations (methods) that can use or affect that data. Thus, an object consists of data and one or more operations or methods that can be performed on that data. The joining of data and operations into a unitary building block is called "encapsulation."

An object can be instructed to perform one of its methods when it receives a "message." A message is a command or instruction to the object to execute a certain method. It consists of a method selection (name) and multiple arguments that are sent to an object. A message tells the receiving object what operations to perform.

One advantage of object-oriented programming is the way in which methods are invoked. When a message is sent to an object, it is not necessary for the message to instruct the object how to perform a certain method. It is only necessary to request that the object execute the method. This greatly simplifies program development.

Object-oriented programming languages are predominantly based on a "class" scheme. A class defines a type of object that typically includes both instance variables and methods for the class. An object class is used to create a particular instance of an object. An instance of an object class includes the variables and methods defined for the class. Multiple instances of the same class can be created from an object class. Each instance that is created from the object class is said to be of the same type or class.

A hierarchy of classes can be defined such that an object class definition has one or more subclasses. A subclass inherits its parent's (and grandparent's etc.) definition. Each subclass in the hierarchy may add to or modify the behavior specified by its parent class.

To illustrate, an employee object class can include "name" and "salary" instance variables and a "set_salary" method. Instances of the employee object class can be created, or instantiated for each employee in an organization. Each object instance is said to be of type "employee." Each employee object instance includes the "name" and "salary" instance variables and the "set_salary" method. The values associated with the "name" and "salary" variables in each employee object instance contain the name and salary of an employee in the organization. A message can be sent to an employee's employee object instance to invoke the "set_salary" method to modify the employee's salary (i.e., the value associated with the "salary" variable in the employee's employee object).

An object is a generic term that is used in the object-oriented programming environment to refer to a module that contains related code and variables. A software application can be written using an object-oriented programming language whereby the program's functionality is implemented using objects.

FIG. 1 is a graphical representation of an object-oriented program 100 that implements a test suite in accordance with one embodiment of the present invention. The object-oriented program 100 includes a base test object 110. Several intermediate extending test objects 122, 124, 126 can extend the base test object 110. Several, more specific extending test objects 140, 142, 144, 146, 148 can also extend any one or more of the base test object 110 and the intermediate test objects 122, 124, 126.

The base test object 110 can include one or more tests or parameter settings to generate a basic test of a device or device simulation. In one embodiment, the base test object includes a transaction generator that generates transactions for testing an aspect of the device. In one embodiment, the basic test object 110 initializes the device under test, establishes basic operating parameters, sends an actual test stimulus to the device under test, and sets a test goal. The test goal can include an end event or condition. The base test object 110 can also include additional functions, tests, etc. In one embodiment, the base test object 110 is a generic test object that generates test transactions that are common across multiple devices such as a family of similar devices and/or generations of similar devices. Because the base test object 110 is generic, the base test object 110 can be used to test the same aspect of any one of several devices or generations of the device without modification to the base test object 110. Any modification to the base test object 110 will impact the transactions generated to test each of the multiple devices and/or generations of devices.

The base test object 110 may be used by any one of a number of other test objects such as intermediate test objects 122, 124, 126, as shown by the links 112, 114, 216 to perform more specific tests on the device under test. The intermediate test objects 122, 124, 126 can add additional detail or additional tests to the base test object 110. For example, the base test object 110 may be a test for an input/output device to read a portion of storage media (e.g., a memory location or a sector of recorded media), one time, at a data transfer rate of 33 MHz. Intermediate test object 122 can extend the base test object 110 by including reading the sector three times (i.e. executing the base test object 110 three times in succession). The intermediate test object 122 can further extend the base test object 110 by modifying the data transfer rate from 33 MHz to 133 MHz. Alternatively, intermediate test object 124 can extend the base test object 110 by including reading the sector four times (i.e. executing the base test object 110 four times) and alternating the reading with an additional test of writing data to the same sector or a sequential sector or other sector that may be defined by the intermediate test object 124.

Similar to the base test object 110, the intermediate test objects 122, 124, 126 can then be used or called by any one or more of the more specific test objects 140, 142, 144, 146, 148 as shown by links 130–139. The specific test objects 140, 142, 144, 146, 148 can extend the intermediate test objects 122, 124, 126 by adding additional detail or specificity to the generated test transactions. In one embodiment, the specific test objects 140, 142, 144, 146, 148 can extend the intermediate test objects 122, 124, 126 to generate test transactions to test respectively defined specific configurations of the device. The specific test objects 140, 142, 144, 146, 148 can also extend the base test object 110 directly as shown by link 118. Additional test cases (not shown) may also use any one or more of the base test object 110, the intermediate test objects 122, 124, 126 and the specific test objects 140, 142, 144, 146, 148. Additional test cases with additional levels of detail may also be used.

Figure 2:
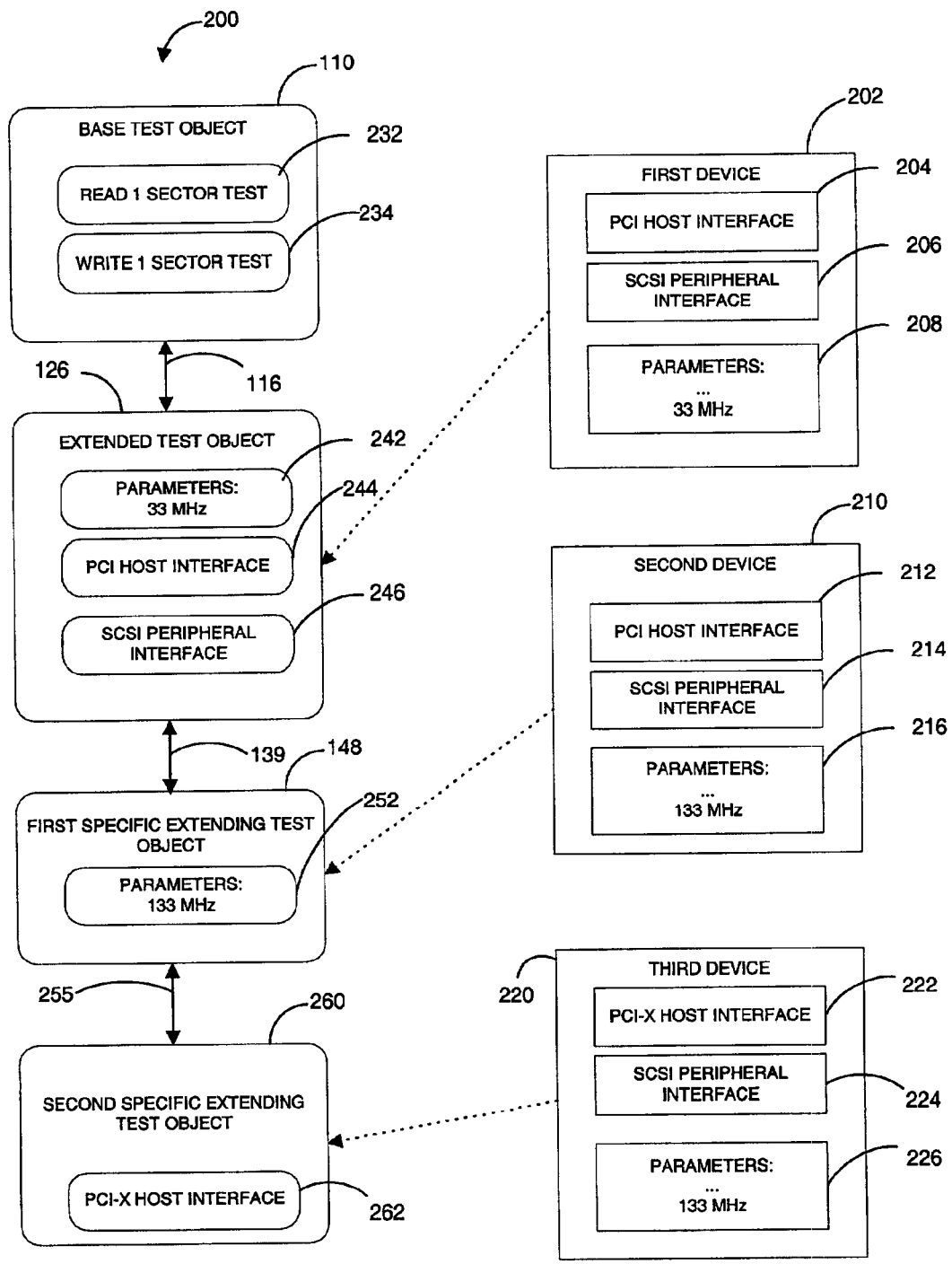
FIG. 2 is a block diagram of a test suite and the corresponding devices that are tested by the test suite, in accordance with one embodiment of the present invention.

FIG. 2 is a block diagram of a test suite 200 and the corresponding devices 202, 210, 220 that are tested by the test suite 200, in accordance with one embodiment of the present invention. The devices 202, 210, 220 are family of related input/output (I/O) controllers. The first device 202 includes a PCI host interface to a host computer and a SCSI interface to a peripheral device such as a hard drive. The first device also operates at 33 MHz and therefore a 33 MHz parameter is listed to further describe the first device 202. The second device 210 is substantially identical to the first device 202 except that the second device 210 operates at 133 MHz. The third device 220 is substantially similar to the second device 210 except that the third device 220 includes a PCI-X interface with the host computer.

The test suite 200 includes a base test object 110. The base test object 110 includes a "Read 1 Sector" test 232 and a "Write 1 Sector" test 234. The Read 1 Sector" test 232 and a "Write 1 Sector" test 234 are both common generic tests that can be applied to any one of the three devices 202, 210, 220. The extending test object 126, is linked to and extends the base test object 110 to test the functions of the first device 202. The extended test object 126 extends the base test object 110 by specifying a parameter of 33 MHz 242 and defining the host interface as a PCI host interface 244 and the peripheral device interface to a SCSI peripheral device interface 246. Executing the extended test object 126 will cause the transaction generator to generate transactions according to the parameters and functions of the first device 202. For example the transactions that are generated by the extended test object 126 could include a device-to-host write transaction formatted for the PCI interface at 33 MHz. Similarly, the generated transactions can include a device-to-peripheral device transaction formatted for the SCSI SPI-3 transfers.

The first specific extending test object 148 is linked to and extends the extending test object 126 to include the parameter of 133 MHz 252 to correspond with the operating parameters of the second device 210. Executing the first specific extending test object 148 will cause the transaction generator to generate transactions according to the parameters and functions of the second device 210. For example the transactions that are generated by the first specific extending test object 148 could include a device-to-host write transaction formatted for the PCI interface at 133 MHz. Similarly, the generated transactions can include a device-to-peripheral device transaction formatted for the SCSI SPI-4 transfers.

The second specific extending test object 260 is linked to and extends the first specific extending test object 148 to include the parameter of a device-to-host interface of a PCI-X interface 262 to correspond with the operating parameters of the third device 220. Executing the second specific extending test object 260 will cause the transaction generator to generate transactions according to the parameters and functions of the third device 220. For example the transactions that are generated by the second specific extending test object 260 could include a device-to-host write transaction formatted for the PCI-X interface at 133 MHz. Similarly, the generated transactions can include a device-to-peripheral device transaction formatted for the SCSI SPI-4 transfers.

Figure 3:
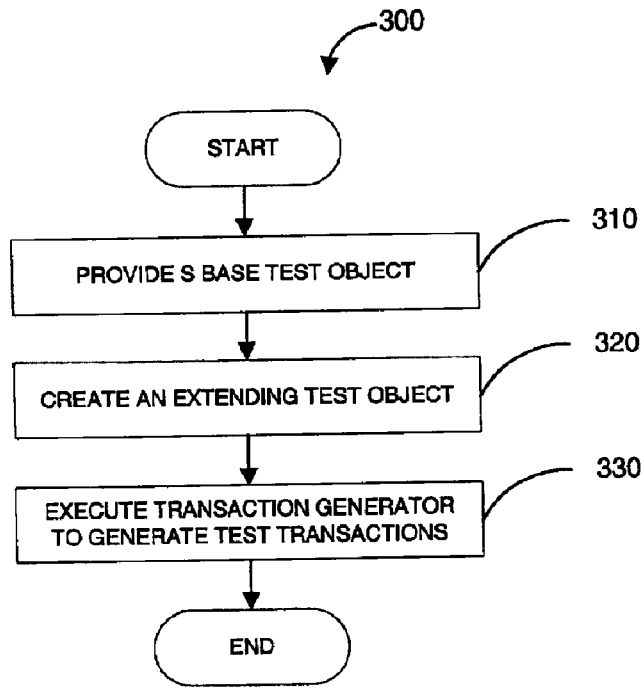
FIG. 3 is a flow chart diagram of the method operations for generating a test case for testing a device, in accordance with one embodiment of the present invention.

FIG. 3 is a flow chart diagram 300 of the method operations for generating a test case for testing a device, in accordance with one embodiment of the present invention. A base test object is provided in operation 310. The base test object can include a transaction generator that generates transactions for testing an aspect of the device. The base test object can also include a goal for the base test case, wherein the goal defines an end to the base test case. The goal can include a default goal in the base test case such as a completion of the generation of the transactions that are generated by the transaction generator. For example, if the transaction generator is set to generate a transaction, which will read a single sector, then the default goal is when the single sector has been read. Alternatively, if the transaction generator generates transactions such as write data at 133 MHz, then a goal is also required such as to continue to generate transactions until two hundred sectors are filled.

An extending test object is created in operation 320. The extending test object inherits the base test object and can define a distinct configuration of the device. The extending test object can override a device configuration in the base test object.

In operation 330, the transaction generator is executed to generate several transactions for an extended test case. The transactions are specifically designed to test the distinct configuration of the device. The generated transactions can include transaction objects that may in turn generate specific transactions that are specifically applicable to the distinct, specific configuration of the device being tested. The generated transactions can include read, a write, an event and an interrupt or other functions and status of the device being tested. In one embodiment, the transaction generator controls the transactions such as the type and the rate of the transactions. In one embodiment, the transaction generator includes parameter settings that can define the type and rate and other aspects of the transactions to be generated. The parameter settings can also include combinations of transactions. Transactions can also include parameter setting such as data transfer rates, buffer sizes, enabling/disabling functions. Transactions can also include status checking, i.e. polling the device under test for a status of a particular buffer, etc. Transactions can also include commands to the device under test such as commanding the device under test to perform a particular logic operation on the input stimuli.

The method operations described in FIG. 3 above can be applied to either of a device simulation in a test bench simulation or similarly to an actual, hardware device.

As discussed above, in object oriented programming, objects are instantiated by classes. The objects can be executed to perform the desired functions and operations. While discussed in terms of "objects" in FIGS. 1 and 2 above, is should be understood that the invention is not limited to objects but rather can include classes which instantiate the objects described above.

The method operations described in FIG. 3 for the construction of a new test case and new test suites is simpler and therefore quicker than the prior art test case production methods because only a few test objects need to be modified to accommodate the unique features in the device under test. Maintenance of the test suite is also simpler because the base test object or objects are common and editing one common base test object modifies all of the test suites that include that base test object. The increased ease of maintenance leads to the previously developed test suites being more accurate and current. Therefore, if a previously developed test object, or a portion thereof, is selected as a basis for a new test object, then the new test object begins as being as accurate and current as possible. If the new test object begins as being as accurate and current as possible, then further modifications to the new test object leads to a more accurately and quickly developed test case.

The method operations described in FIG. 3 also provides more comparable test data from similar devices. Using common test objects and therefore common test transactions which are generated in common methods, ensures that the testing of one distinct configuration of a device is substantially similar to the testing of a second distinct configuration of the device. Substantially similar testing provides more accurately and directly comparable test data because the testing is performed in substantially the same order, via substantially the same test processes. For example there may be several methods to test a particular feature of a family of devices under test. However, because the transactions produced to test that feature are substantially the same, then the performance of that particular feature in one member of the family of devices can be directly compared to the corresponding performance of a second member of the family of devices.

In Table 1 below is an excerpt of a constructor from a base test class such as in the test_base.vr exemplary computer code, which is included in more detail further below. The constructor constructs any objects required by the base test object to execute the test.

TABLE 1

```
task Test_base::new((Config_contain config_contain) {
    this.config_contain = config_contain;
    chan_usage = ONECH;
    inst_container = null;
}
```

In Table 2 below is an excerpt of a transaction generator from a base test class such as in the test_base.vr exemplary computer code, which is included in more detail further below. The transaction generator constructs any transactions and transaction objects required by the base test object to execute the test.

TABLE 2

```
task Test_base::generate(int mbx_id) {
    Messages msg = inst_container.get_msg( );
    ...
}
```

As described above, the goal is a setting that determines when a test is complete. For example, the goal could be that the test is complete when the transaction generator has generated all of the designated transactions. Alternatively, the goal may be to monitor the device under test for a specific condition such as a buffer has been filled or a particular signal is output from the device under test. In Table 3 below is an excerpt of a goal from a base test class such as in the test_base.vr exemplary computer code, which is included in more detail further below. The goal defines the goal of the base test object.

TABLE 3

```
task Test_base::goal( ) {
sync (ALL, generate_done);
}
```

In the above example, the goal is to wait until the generate function is completed. The example goal above can be extended to other results or status or events in methods that extend the base test object 110.

In Table 4 below is an excerpt of an execution controller such as in an intermediate extending object 122 in FIG. 3 above. The execution controller in the intermediate extending object 122 extends the execution controller in the base test object.

TABLE 4

```
task H2_test::run(Inst_contain inst_cont_in) {
H2_inst_contain h2_inst_container;
int driver_mailbox;
Io_spi spi;
Spi_bus spi_bus;
Messages msg = inst_cont_in.get_msg( );
inst_container = inst_cont_in;
cast_assign(h2_inst_container, inst_cont_in);
...
}
```

Figure 4:
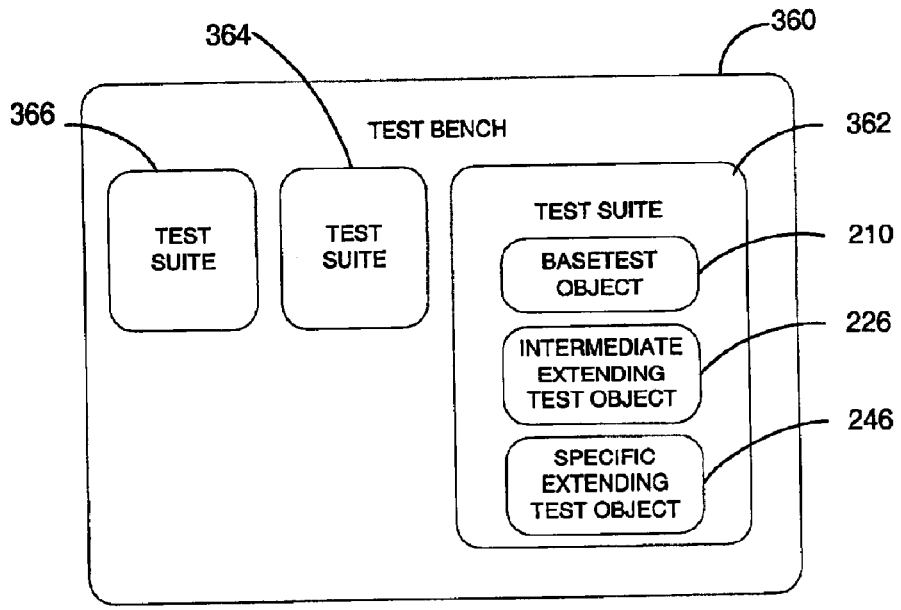
FIG. 4 illustrates a test bench in accordance with one embodiment of the present invention.

FIG. 4 illustrates a test bench 360 in accordance with one embodiment of the present invention. The test bench includes a base test suite 362. The test suite 362 includes several test objects 110, 126, 146. Base test object 110 is a generic base test object as described above. Test objects 126 and 146 extend the base test object 110 such as described above in FIG. 1. Test bench 360 can also include additional test suites 364, 366. Test suites 364, 366 include additional test objects. In one embodiment, the test suites 364, 366 include test objects that extend base test object 110.

While the above embodiments have been directed toward test cases and test benches applied to a device simulation, one skilled in the art will recognize that the concepts described can also be applied to actual hardware devices. Therefore, the test cases can also provide additional test data that compares the simulated device performance with the actual hardware device performance.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations. An exemplary structure for the invention is described below.

Figure 5:
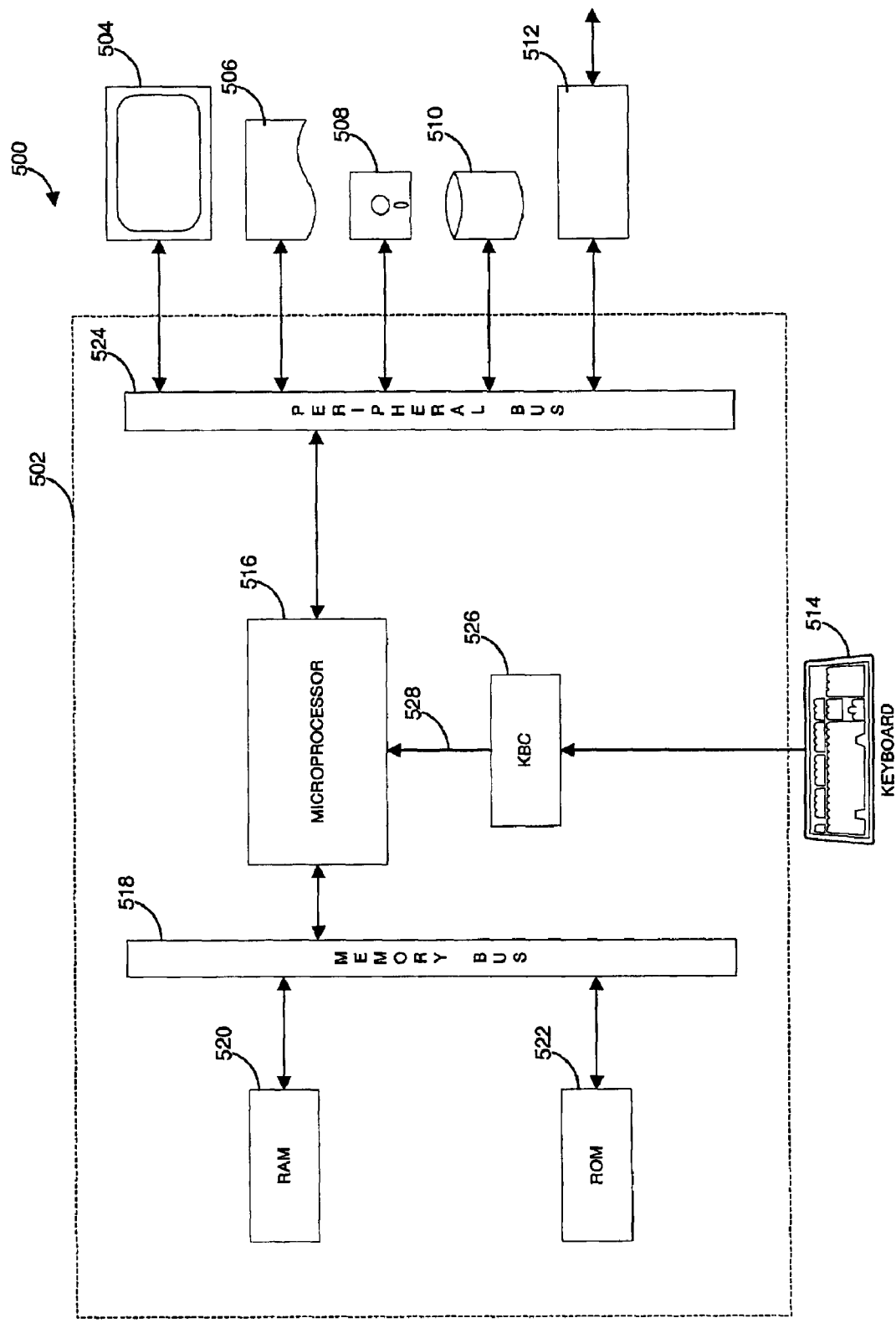
FIG. 5 shows a block diagram of an exemplary computer system 500 in accordance with one embodiment of the present invention.

FIG. 5 shows a block diagram of an exemplary computer system 500 in accordance with one embodiment of the present invention. The computer system 500 includes a digital computer 502, a display screen (or monitor) 504, a printer 506, a floppy disk drive 508, a hard disk drive 510, a network interface 512, and a keyboard 514. The digital computer 502 includes a microprocessor 516, a memory bus 518, random access memory (RAM) 520, read only memory (ROM) 522, a peripheral bus 524, and a keyboard controller (KBC) 526. The digital computer 502 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 516 is a general-purpose digital processor, which controls the operation of the computer system 500. The microprocessor 516 can be a single-chip processor or can be implemented with multiple components. Using instructions retrieved from memory, the microprocessor 516 controls the reception and manipulation of input data and the output and display of data on output devices.

The memory bus 518 is used by the microprocessor 516 to access the RAM 520 and the ROM 522. The RAM 520 is used by the microprocessor 516 as a general storage area and as scratch-pad memory, and can also be used to store input data and processed data. The ROM 522 can be used to store instructions or program code followed by the microprocessor 516 as well as other data.

The peripheral bus 524 is used to access the input, output, and storage devices used by the digital computer 502. In the described embodiment, these devices include the display screen 504, the printer device 506, the floppy disk drive 508, the hard disk drive 510, and the network interface 512. The keyboard controller 526 is used to receive input from keyboard 514 and send decoded symbols for each pressed key to microprocessor 516 over bus 528.

The display screen 504 is an output device that displays images of data provided by the microprocessor 516 via the peripheral bus 524 or provided by other components in the computer system 500. The printer device 506, when operating as a printer provides an image on a sheet of paper or a similar surface. Other output devices such as a plotter, typesetter, etc. can be used in place of, or in addition to, the printer device 506.

The floppy disk drive 508 and the hard disk drive 510 can be used to store various types of data. The floppy disk drive 508 facilitates transporting such data to other computer systems, and hard disk drive 510 permits fast access to large amounts of stored data. The hard disk drive 510 can also include multiple hard disk drives and/or other mass storage devices such as CD-ROMs, CD-Rs, CD-RWs, magnetic tapes, and other optical and non-optical data storage devices.

The microprocessor 516 together with an operating system operate to execute computer code and produce and use data. The computer code and data may reside on the RAM 520, the ROM 522, or the hard disk drive 510. The computer code and data could also reside on a removable program medium and loaded or installed onto the computer system 500 when needed. Removable program media include, for example, CD-ROM, PC-CARD, floppy disk and magnetic tape.

The network interface 512 is used to send and receive data over a network connected to other computer systems. An interface card or similar device and appropriate software implemented by the microprocessor 516 can be used to connect the computer system 500 to an existing network and transfer data according to standard protocols.

The keyboard 514 is used by a user to input commands and other instructions to the computer system 500. Other types of user input devices can also be used in conjunction with the present invention. For example, pointing devices such as a computer mouse, a track ball, a stylus, or a tablet can be used to manipulate a pointer on a screen of a general-purpose computer.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter, be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over network coupled computer systems so that the computer readable code is stored and executed in a distributed fashion.

It will be further appreciated that the instructions represented by the blocks in FIG. 3 are not required to be performed in the order illustrated, and that all the processing represented by the blocks may not be necessary to practice the invention. Further, the processes described in FIG. 3 can also be implemented in software stored in any one of or combinations of the RAM 520, the ROM 522, or the hard disk drive 510.

There follows exemplary computer code for illustrating one embodiment of the present invention.

TEST_BASE.VR

```
// method Test_base::new
//    - constructor
task Test_base: :new(Config_contain config_contain) {
    this.config_contain = config_contain;
    chan_usage = ONECH;
    inst_container = null;
    // derived classes may override the parameters in the config container
    // The also would have the following instead of the above assignment:
    //    super.new(config_contain);
} // method Test_base: :new
// Method Test_base: :run
//    - This provides basic functionality for most tests which
//    have simple goals. This can be overridden
task Test_base: :run(Inst_contain inst_cont_in) {
    int driver_mailbox;
    Messages msg = inst_cont_in.get_msg( );
    inst_container = inst_cont_in;
    // configure the environment before starting the generate and goal
    if (config_contain.configure(inst_container)) {
```

TEST_BASE.VR -continued

```
        msg.write("Bad configuration - test skipped\n", ERROR_MSG);
        return;                         // skip test if bad config
    }
    // get driver mailbox
    driver = inst_container.get_driver( );
    driver_mailbox = driver.get_driver_mailbox( );
    // fork generator into background since goal doesn't
    // have to depend on completion of the generator (i.e. it
    // might have an endless generation loop0
    fork
        begin
            generate(driver_mailbox);
            trigger(generate_done);
        end
    join none
    goal( );
    // If the generate won't stop
    // until the goal is reached, a private class
    // variable can be set in goal( ) so it stops
    // the generate( ) from creating new trs (derived
    // class should instantiate private variable)
    // stop background traffic (depend on container to call it for
    // all the instances of background traffic generators)
    inst_container.stop_bgt( );
    // block here until all test and background traffic TR have completed.
    driver.wait_complete( );
} // method Test_base: :run
// PROTECTED METHODS
//
// method Test_base: :goal
//    - default goal is to wait for generator to complete
task Test_base: :goal( ) {
    sync(ALL, generate_done);
} // method Test_base: :goal
// method Test_base: :generate
//    - Virtual task that should never get called. Every test
//    can define this task.
Task Test_base: :generate(int mbx_id) {
    Messages msg = inst_container.get_msg( );
    Msg.write ("The Test_base: :generate method should never be called.
This can be defined in the derived class.\n", FATAL_ERROR);
} // method Test_base: :generate
```

H2_TEST.VR

```
// method run
task H2_test: :run(Inst_contain inst_cont_in) {
    H2_inst_contain h2_inst_container;
    int driver_mailbox;
    Io_spi spi;
    Spi_bus spi_bus;
    Messages msg = inst_cont_in.get_msg( );
    inst_container = inst_cont_in;
    cast_assign(h2_inst_container, inst_cont_in);
    // configure the environment before starting the generate and goal
    if (config_contain.configure(h2_inst_container)) {
        msg.write("Bad configuration - test skipped\n", ERROR_MSG);
        return;                         // skip test if bad config
    }
    // get driver mailbox
    driver = h2_inst_container.get_driver( );
    driver_mailbox = driver.get_driver_mailbox( );
    // fork generator into background since goal doesn't
    // have to depend on completion of the generator (i.e. it
    // might have an endless generation loop)
    fork
        begin
            generate(driver_mailbox);
            trigger(generate_done);
        end
    join none
    goal( );
```

-continued

H2_TEST.VR

```
    // If the generate won't stop
    // until the goal is reached, a private class
    // variable can be set in goal( ) so it stops
    // the generate( ) from creating new trs (derived
    // class should instantiate private variable)
    // stop background traffic (depend on container to call it for
    // all the instances of background traffic generators)
    h2_inst_container.stop_bgt( );
    // block here until all test and background traffic TR have completed.
    driver.wait_complete( );
} // method run
```

READ1SECTOR.VR

Functional Description:
SCB Description:
1st SCB

| | | |
|---|---|---|
| Transaction Type | Read | (Read/Write) |
| Number of Blocks | 32 | |
| SCSI Target | 1st | |
| Transfer Size | 16384 bytes | |
| SG Segment Size | 4096 bytes | |
| SG Address Alignment | 4 bytes | |

SCSI Target Description:
1st Target

| | | |
|---|---|---|
| ID | low | |
| Bus Mode | LVD | (SE/LVD) |
| Bus Sizw | Wide | (Wide/Narrow) |
| Block Size | 64 byte | |
| Bus Transfer Type | DT | (ST/DT) |
| Bus Speed | 160 MHz | |
| Bus Transfer Rate | 320 MB/s | |
| Bus FRC | Enabled | (Enabled/Disabled) |
| BUS Transmit Type | Packetized | (Legacy/DataGroups/Packetized) |
| Bus QAS | Disabled | (Enabled/Disabled) |
| Offset | 16 | |
| Disconnection | Enabled | (Enabled/Disabled) |
| Disconnect Size | No disconnect places given | |
| Data Streaming | Disabled | |

PCI Interface:

| | | |
|---|---|---|
| Mode | PCI | (PCI-X/PCI) |
| Speed | 33 | (33/66/133) |
| 64-bit slave | Enabled | (Enabled/Disabled) |
| 64-bit master | Disabled | (Enabled/Disabled |

Harpoon2 Setup:

| | | |
|---|---|---|
| 64-bit Addressing | Disabled | (Enabled/Disabled) |
| 64-bit Data | Disabled | (Enabled/Disabled) |
| Interrupt Type | MSI | (Normal/MSI) |
| Register Mapping | I/O | (I/O or Memory) |
| Initialization Type | Normal | (Normal/Legacy) |

```
#define OUTPUT_EDGE         PHOLD
#define OUTPUT_SKEW         #1
#define SPI_OUTPUT_SKEW     #1
#define INPUT_EDGE          PSAMPLE
#define  INPUT_SKEW         #-1
#include <vera_defines.vrh>
#include "global.h"
#include "h2_test.vrh"
#include "tst_tr.vrh"
#include "inst_contain.vrh"
#include "h2_inst_contain.vrh"
#include "io_bgt_base.vrh"
#include "io_conf.vrh"
#include "io_spi_conf.vrh"
#include "io_bgt_spi.vrh"
```

-continued

READ1SECTOR.VR

```
#include "h2_config_contain.vrh"
class Read1secotor extends H2_test  {
    task new(Config_contain config_contain)
    virtual task generate (int mbx);
}
// method new
task Read1secotr ::new(Config_contain config_contain) {
    string value_str;
    Host_dev_config dev;
    Io_spi_config io_spi_c;
    Io_dev_config io_dev_c;
    int num_scb_max;
    Host_config_class hconf = config_contain.get_host_config(0);
    Driver_dut_config_class dconf =
    config_contain.get_driver_config( );
    Io_config_class ioc = config_contain.get_io_config(0);
    Io_bgt_config iobgt = config_contain.get_io_bgt_config(0);
    Osm_config_class osm = config_contain.get_osm_config ( );
    super.new(config_contain);
    num_scb_max = 16;
    dconf.set_param("tr_data", "0-100"); // Set incrementing data pattern
    dconf.set_param("flag_64bit_addr","0"); // Set 32 bit
                                            addressing mode
    sprintf(value_str, "%0d", DUT_SCB_SIZE_32BIT_ADDR *
        num_scb_max + DUT_DONE_Q_ENTRY_SIZE *
        num_scb_max + 8 + 512 * 4 + 16 * 4); // MSI + Data + SG List
    dconf.set_param("channel_memory_size", value_str);
    sprintf(value_str, "%0d", num_scb_max);
    dconf.set_param("scb_max_entry_count" value_str );
    sprintf(value_str. "%0d", DUT_SCB_SIZE_32BIT_ADDR *
        num_scb_max );
    dconf.set_param("scb_memory_size", value_str);
    dconf.set_param("scb_address_space", "0");
    sprintf(value_str, "%0d", DUT_SCB_SIZE_32BIT_ADDR*
        num_scb_max );
    dconf.set_param("ext_scb_addr", value_str);
    dconf.set_param("next_scb_addr", "0");
    sprintf(value_str, "%0d", DUT_SCB_SIZE_32BIT_ADDR*
        num_scb_max * 2);
    dconf.set_param("scb_done_base_addr", value.str);
    sprintf(value_str. "%0d", DUT_DONE_Q_ENTRY_SIZE *
        num_scb_max);
    dconf.set_param("done_queue_memory_size", value.str);
    sprintf(value_str, "%0d", DUT_SCB_SIZE_32BIT_ADDR *
num_scb_max * 2 + DUT_DONE_Q_ENTRY_SIZE *
num_scb_max + 8);
    dconf.set_param("host_data_addr", value.str);
    sprintf(value_str, "%0d", DUT_SCB_SIZE_32BIT_ADDR *
num_scb_max * 2 + DUT_DONE_Q_ENTRY_SIZE *
num_ocb_max);
    dconf.set_param("msi_data_addr", value.str);
    dconf.set_param("msi_data_size", "8");
    dconf.set_param("msi_enable", "1");
    dconf.set_param("flag_registers_memory_mapped", "0");
    dconf.set_param_num("pcix_tr_build_timeout",
        2*DEFAULT_TIMEOUT);
    dconf.set_param_num("scsi_tr_build_timeout",
        2*DEFAULT_TIMEOUT);
    //Set up Host side
    hconf.set_param("system_64", "0");
    hconf.set_param("clock", "33");
    hconf.set_param("pcix", "false");
    dev = hconf.get_dev_config(0);
    dev.set_param("device_64", "0");
    sprintf(value_str. "%0d", num_scb_max * 32768);
    dev.set_param("addr_size", "value.str");
    // Set up I/O side
    cast-assign(io_spi_c, ioc );
    // Parameter "type" value(s) are:
    // - spi_se   (Single Ended bus type)
    // -spi_lvd   (LVD bus type)
    sprintf(value_str, "%0d", "spi_lvd");
    io_spi_c.set_param("type", value_str);
    // Parameter "trans_type" value(s) are:
    // - spi_async       (Asynchronous Transfer)
    // - spi_st_data     (ST Synchronous Transfer)
    // - spi_dt_data     (Data groups SPI-3, LVD & Wide only)
```

READ1SECTOR.VR

```
//  - spi_iu           (Packetized SPI-3, LVD & Wide only)
//  - spi_qarb_iu      (Packetized QAS SPI-3, LVD & Wide only)
//  - spi_dt_data-frc  (Data groups SPI-4, LVD & Wide only)
//  - spi_iu_frc       (Packetized SPI-4, LVD & Wide only)
//  - spi_qarb_iu_frc  (Packetized QAS SPI-4, LVD & Wide only)
sprintf(value_str, "%0d", spi_iu_frc);
io_spi_c.set_param_for_all_dev("trans_type", value.str);
// Parameter "period_factor" value(s) are:
//  - 8  (6.25 ns or 160 MHz transfer Rate, SPI-4 only)
//  - 9  (12.5 ns or 80 MHz transfer Rate, SPI-3 & SPI-4 only)
//  - 10 (25 ns or 40 MHz transfer Rate)
//  - 11 (30.3 ns or 33 MHz transfer Rate)
//  - 12 (50 ns or 20 MHz transfer Rate)
//  - 19 (75 ns or 13 MHz transfer Rate)
//  - 25 (100 ns or 10 MHz transfer Rate)
//  - 37 (150 ns or 6.7 MHz transfer Rate)
//  - 50 (200 ns or 5 MHz transfer Rate)
io_spi_c.set_param_for_all_dev("period_factor", "8");
io_spi_c.set_param_for_all_dev("offset", "16");
io_spi_c.set_param_for_all_dev("block_size", "512");
io_spi_c.set_param_for_all_dev("queue_tag", "0–100");
io_spi_c.set_param_for_all_dev("data_transfer_length", "40");
io_spi_c.set_param_for_all_dev("packet_size", "40");
io_spi_c.set_param_for_all_dev("disconnect_en", "1");
io_spi_c.set_param_for_all_dev("cmd_queue_size", "4");
sprintf(value_str, "%0d", spi_random);
io_spi_c.set_param_for_all_dev("cmd_order", value_str);
io_spi_c.set_param_for_all_dev("crc_interval",
"30 29 32 31 62 64 63 61");
io_spi_c.set_param_for_all_dev("disconnect_before_status", "1");
iobgt.set_param("cmd", "1, 3, 5");
iobgt.set_param("delay", "130");
iobgt.set_param("length_blocks", "1");
iobgt.set_param("length_bytes", "512");
iobgt.set_param("data", "2–7");
iobgt.set_param("lba", "55–60");
osm.set_param("sg_segment_size", "4096");
//osm.set_param("sg_element_address_alignment", "0");
} // method new
// method Read1sector: :generate
//  - Toss in two TRs
task Read1sector: :generate(int mbx) {
    Test_tr_class tr;
    tr = new;
    tr.set_length(l);
    tr.set_timeout(DEFAULT_TIMEOUT, 0);
    mailbox_put(mbx, tr);
} // method Read1sector: :generate
```

READ1SECTOR_133PCIX.VR

Functional Description:
SCB Description:
1st SCB

| | | |
|---|---|---|
| Transaction Type | Read | (Read/Write) |
| Number of Blocks | 32 | |
| SCSI Target | 1st | |
| Transfer Size | 16384 bytes | |
| SG Segment Size | 4096 bytes | |
| SG Address Alignment | 4 bytes | |

SCSI Target Description:
1st Target

| | | |
|---|---|---|
| ID | low | |
| Bus Mode | LVD | (SE/LVD) |
| Bus Sizw | Wide | (Wide/Narrow) |
| Block Size | 64 byte | |
| Bus Transfer Type | DT | (ST/DT) |
| Bus Speed | 160 MHz | |
| Bus Transfer Rate | 320 MB/s | |
| Bus FRC | Enabled | (Enabled/Disabled) |
| BUS Transmit Type | Packetized | (Legacy/DataGroups/Packetized) |
| Bus QAS | Disabled | (Enabled/Disabled) |
| Offset | 16 | |
| Disconnection | Enabled | (Enabled/Disabled) |
| Disconnect Size | No disconnect places given | |
| Data Streaming | Disabled | |

PCI Interface:

| | | |
|---|---|---|
| Mode | PCI | (PCI-X/PCI) |
| Speed | 33 | (33/66/133) |
| 64-bit slave | Enabled | (Enabled/Disabled) |
| 64-bit master | Disabled | (Enabled/Disabled) |

Harpoon2 Setup:

| | | |
|---|---|---|
| 64-bit Addressing | Disabled | (Enabled/Disabled) |
| 64-bit Data | Disabled | (Enabled/Disabled) |
| Interrupt Type | MSI | (Normal/MSI) |
| Register Mapping | I/O | (I/O or Memory) |
| Initialization Type | Normal | (Normal/Legacy) |

```
$Log: rdl_p33nnim_3201vwdts_pf_long16k.vr.v $
Revision 1.4 2001/10/25 21:34:35 lee11610
Removed obsolete parameters.
Revision 1.3 2001/10/15 20:31:37 cha22184
1. Changed test derivation from Test_base class to H2_test class.
2. Changed #include "test_base.vrh" to #include "h2_test.vrh".
Revision 1.2 2001/09/28 17:20:53 cha22184
1. Removed obsolete driver parameter "flag_64bit_data".
2. Added host parameter "system_64" and host dev parameter
"device_64" to properly program 32-bit/64-bit bus.
3. Double TR timeout parameters now that test runs twice as slow with
true 32-bit bus.
Revision 1.1.1.1 2001/07/31 20:23:35 harpoon2a2
    Starting harpoon2a2 from harpoon2a1 with vera test bench included in it
Revision 1.3 2001/06/21 22:28:28 cha22184
Replaced parameter "write_cache_enable" with parameter
"disconnect_before_status".
This check-in corrects the previous check-in where "write_cache_enable"
was removed by not replaced.
Revision 1.2 2001/06/18 23:07:47 cha22184
1. Removed parameters "in_per_cmd" and in_per_data_stream".
2. Replaced with new parameters "data_transfer_length" and
"packet_size"
3. Removed "write_cache_enabled" parameter.
Revision 1.1 2001/09/01 17:58:04 spi13307
Initial checkin
#define OUTPUT_EDGE        PHOLD
#define OUTPUT_SKEW        #1
#define SPI_OUTPUT_SKEW    #1
#define INPUT_EDGE         PSAMPLE
#define INPUT_SKEW         #-1
#include <vera_defines.vrh>
#include "global.h"
#include "h2_test.vrh"
#include "tst_tr.vrh"
#include "inst_contain.vrh"
#include "io_bgt_base.vrh"
#include "io_conf.vrh"
#include "io_spi_conf.vrh"
#include "io_bgt_spi.vrh"
#include "h2_config_contain.vrh"
#include "read1sector.vrh"
class Read1sector_133pcix extends Read1sector {
    task new(config_contain config_contain)
}
//method new
task Read1sector_133pcix: :new(Config_contain config_contain) {
    Host_config_class hconf;
    super.new(config_contain);
    hconf = config_contain.get_host_config(0);
    // Set up Host side
    hconf.set_param("clock", "133");
    hconf.set_param("pcix", "true");
}// method new
```

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for generating a test case for testing a distinct configuration of a device to be connected to a computer system comprising:
   providing a base test object that defines test properties for a device, the base test object including a transaction generator that generates transactions for testing an aspect of the device;
   creating an extending test object that defines test properties for a distinct configuration of the device, the extending test object inheriting at least one test property of the base test object, the extending test object modifying at least one test property in the base test object; and
   executing the transaction generator to generate a plurality of transactions for the test case, each transaction of the plurality of transactions defining a stimulus being specifically designed to stimulate at least one test property of the distinct configuration of the device.

2. A method for generating a test case for testing a distinct configuration of a device to be connected to a computer system comprising:
   providing a base test object that defines test properties for a device, the base test object including a transaction generator that generates transactions for testing an aspect of the device;
   creating an extending test object that defines test properties for a distinct configuration of the device including overriding at least one test property in the base test object, the extending test object inheriting at least one test property of the base test object; and
   executing the transaction generator to generate a plurality of transactions for the test case, each transaction of the plurality of transactions defining a stimulus being specifically designed to stimulate at least one test property of the distinct configuration of the device.

3. The method of claim 1, wherein a test property includes at least one of a group consisting of a function of the device and an operating parameter of the device.

4. The method of claim 1, wherein the stimulus can include a plurality of transaction objects.

5. The method of claim 1, wherein the stimulus includes at least one of a group consisting of a read, a write, an event and an interrupt.

6. The method of claim 1, wherein the transaction generator controls the transactions.

7. The method of claim 6, wherein controlling the transaction includes controlling a type of the transactions.

8. The method of claim 6, wherein controlling the transaction includes controlling a rate of the plurality of transactions.

9. The method of claim 1, wherein the base test object includes a goal for the base test case, wherein the goal defines an end to the base test case.

10. The method of claim 9, wherein the goal includes a default goal in the base test case.

11. The method of claim 10, wherein the default goal includes a completion of the generation of the plurality of transactions.

12. The method of claim 1, wherein the device is a simulated device.

13. The method of claim 1, wherein the device is a hardware device.

14. The method of claim 1, wherein a modification to the base test object modifies the function of the extending test object.

15. A method for generating a test case for testing a distinct configuration of a device to be connected to a computer system comprising:
   providing a base test class that defines test properties for a device, the base test object including a transaction generator that generates transactions for testing an aspect of the device;
   creating an extending test class that defines test properties for a distinct configuration of the device, the extending test class inheriting at least one test property of the base test class, the extending test object modifying at least one test property in the base test object; and
   executing the transaction generator to generate a plurality of transactions for the test case, each transaction of the plurality of transactions defining a stimulus being specifically designed to stimulate at least one test property of the distinct configuration of the device.

16. A test bench comprising:
   a processor;
   a storage facility coupled to the processor and containing instructions executable by the processor wherein the instructions include:
      a base test object that defines test properties for a device, the base test object including a transaction generator that generates transactions for testing an aspect of the device;
      an extending test object that defines test properties for a distinct configuration of the device, the extending test object inheriting at least one test property of the base test object, the extending test object modifying at least one test property in the base test object; and
      logic to execute the transaction generator to generate a plurality of transactions for the test case, each transaction of the plurality of transactions defining a stimulus being specifically designed to stimulate at least one test property of the distinct configuration of the device.

17. A method for testing a device, comprising:
   defining a base test object for the device, the base test object being configured to exercise basic operations of the device; and
   defining an extending test object, the extending test object being configured change an overall operation of the device to be tested, the extending test object modifying at least one test property in the base test object, the extending test object identifying transactions to be processed so as to change the overall operation of the device.

18. The method of claim 17, wherein the base test object includes:
   a function generator which generates the identified transactions for testing an aspect of the device; and
   a goal which determines when the base test is complete.

19. The method of claim 17, wherein a plurality of extending tests objects can modify the base test object.

20. The method of claim 2, wherein a test property includes at least one of a group consisting of a function of the device and an operating parameter of the device.

21. The method of claim 2, wherein the stimulus can include a plurality of transaction objects.

22. The method of claim 2, wherein the stimulus includes at least one of a group consisting of a read, a write, an event and an interrupt.

23. The method of claim 2, wherein the transaction generator controls the transactions.

24. The method of claim 23, wherein controlling the transaction includes controlling a type of the transactions.

25. The method of claim 23, wherein controlling the transaction includes controlling a rate of the plurality of transactions.

26. The method of claim 2, wherein the base test object includes a goal for the base test case, wherein the goal defines an end to the base test case.

27. The method of claim 26, wherein the goal includes a default goal in the base test case.

28. The method of claim 27, wherein the default goal includes a completion of the generation of the plurality of transactions.

29. The method of claim 2, wherein the device is a simulated device.

30. The method of claim 2, wherein the device is a hardware device.

31. The method of claim 2, wherein a modification to the base test object modifies the function of the extending test object.

32. A method for generating a test case for testing a distinct configuration of a device to be connected to a computer system comprising:

providing a base test class that defines test properties for a device, the base test object including a transaction generator that generates transactions for testing an aspect of the device;

creating an extending test class that defines test properties for a distinct configuration of the device including overriding at least one test property in the base test object, the extending test class inheriting at least one test property of the base test class; and executing the transaction generator to generate a plurality of transactions for the test case, each transaction of the plurality of transactions defining a stimulus being specifically designed to stimulate at least one test property of the distinct configuration of the device.

33. A test bench comprising:

a processor;

a storage facility coupled to the processor and containing instructions executable by the processor wherein the instructions include:

a base test object that defines test properties for a device, the base test object including a transaction generator that generates transactions for testing an aspect of the device;

an extending test object that defines test properties for a distinct configuration of the device, the extending test object inheriting at least one test property of the base test object, the extending test object overriding at least one test property in the base test object; and logic to execute the transaction generator to generate a plurality of transactions for the test case, each transaction of the plurality of transactions defining a stimulus being specifically designed to stimulate at least one test property of the distinct configuration of the device.

34. A method for testing a device, comprising:

defining a base test object for the device, the base test object being configured to exercise basic operations of the device; and defining an extending test object, the extending test object being configured change an overall operation of the device to be tested, the extending test object includes overriding at least one test property in the base test object, the extending test object identifying transactions to be processed so as to change the overall operation of the device.

35. The method of claim 34, wherein the base test object includes:

a function generator which generates the identified transactions for testing an aspect of the device; and a goal which determines when the base test is complete.

36. The method of claim 34, wherein a plurality of extending tests objects can modify the base test object.

* * * * *